(12) United States Patent
Kim et al.

(10) Patent No.: US 11,257,623 B2
(45) Date of Patent: Feb. 22, 2022

(54) MULTILAYERED ELECTRONIC COMPONENT AND BOARD HAVING THE SAME MOUNTED THEREON

(71) Applicant: SAMSUNG ELECTRO-MECHANICS CO., LTD., Suwon-si (KR)

(72) Inventors: Hyun Tae Kim, Suwon-si (KR); Beom Seock Oh, Suwon-si (KR); Tai Won Choi, Suwon-si (KR); Woo Soon Whang, Suwon-si (KR); Byoung Woo Kim, Suwon-si (KR); Yong Won Seo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/912,025

(22) Filed: Jun. 25, 2020

(65) Prior Publication Data
US 2021/0217559 A1    Jul. 15, 2021

(30) Foreign Application Priority Data

Jan. 15, 2020   (KR) .......................... 10-2020-0005276
Jun. 17, 2020   (KR) .......................... 10-2020-0073857

(51) Int. Cl.
*H01G 4/232*    (2006.01)
*H05K 1/18*    (2006.01)
*H01G 4/30*    (2006.01)

(52) U.S. Cl.
CPC ........... *H01G 4/2325* (2013.01); *H05K 1/181* (2013.01); *H01G 4/30* (2013.01); *H05K 2201/10015* (2013.01); *H05K 2201/10515* (2013.01); *H05K 2201/10636* (2013.01); *H05K 2201/10734* (2013.01)

(58) Field of Classification Search
CPC ........ H01G 4/2325; H01G 4/30; H05K 1/181; H05K 2201/10734; H05K 2201/10636; H05K 2201/10515; H05K 2201/10015
See application file for complete search history.

(56) References Cited

U.S. PATENT DOCUMENTS

| | | | | |
|---|---|---|---|---|
| 2013/0200749 A1* | 8/2013 | Nishisaka | ............... | H01C 1/148 310/311 |
| 2014/0041913 A1* | 2/2014 | Yanagida | .................. | H01G 4/30 174/260 |
| 2014/0111300 A1* | 4/2014 | Park | .......................... | B05D 5/12 338/22 R |

(Continued)

FOREIGN PATENT DOCUMENTS

| JP | 2017-195329 A | 10/2017 |
|---|---|---|
| KR | 10-1089925 B1 | 12/2011 |

*Primary Examiner* — Steven T Sawyer
(74) *Attorney, Agent, or Firm* — Morgan, Lewis & Bockius LLP

(57) ABSTRACT

A multilayer electronic component includes: a body including a dielectric layer and an internal electrode alternately disposed with the dielectric layer; and an external electrode including an electrode layer disposed on the body and an Sn plating layer disposed on the electrode layer. A thickness of the body is defined as Tb, a thickness of the Sn plating layer is defined as Ts, Tb is 0.22 mm or less, and Ts is 4.5 µm or more.

16 Claims, 5 Drawing Sheets

(56) References Cited

U.S. PATENT DOCUMENTS

| | | | |
|---|---|---|---|
| 2015/0287532 A1* | 10/2015 | Abe | H01G 4/2325 |
| | | | 174/260 |
| 2017/0250026 A1* | 8/2017 | Mizuno | H01G 4/232 |
| 2017/0309402 A1 | 10/2017 | Yamashita | |
| 2018/0012838 A1* | 1/2018 | Arvin | H01L 24/17 |
| 2018/0323010 A1* | 11/2018 | Park | H05K 1/181 |
| 2020/0328028 A1* | 10/2020 | Maekawa | H01G 4/2325 |

\* cited by examiner

I-I'

MULTILAYERED ELECTRONIC COMPONENT AND BOARD HAVING THE SAME MOUNTED THEREON

CROSS-REFERENCE TO RELATED APPLICATION

This application claims the benefit of priority to Korean Patent Applications No. 10-2020-0005276 filed on Jan. 15, 2020 and No. 10-2020-0073857 filed on Jun. 17, 2020, with the Korean Intellectual Property Office, the disclosure of which is incorporated herein by reference.

BACKGROUND

The present disclosure relates to a multilayer electronic component and a board having the same mounted thereon.

A multilayer ceramic capacitor (MLCC), a type of multilayer electronic component, is a chip type condenser, mounted on the printed circuit boards of various types of electronic products, including image display devices, such as a liquid crystal display (LCD) and a plasma display panel (PDP), a computer, a smartphone, a mobile phone, and the like, serving to charge electricity therein or discharge electricity therefrom.

The multilayer ceramic capacitor may be used as a component of various electronic devices due to advantages thereof, such as miniaturization, high capacity, and ease of mounting. As electronic devices such as computers and mobile devices are miniaturized and implemented with high output, demand for miniaturization and implementation of high capacity of a multilayer ceramic capacitor are increasing.

In order to achieve miniaturization and high capacity for the multilayer ceramic capacitor, thinning of a dielectric layer and an internal electrode is progressing.

In addition, in addition to thinning of the dielectric layer and the internal electrode, there is a need to develop a configuration of an external electrode for maximizing utilization of space on the substrate.

SUMMARY

An aspect of the present disclosure is to provide a multilayer electronic component for maximizing utilization of space on a substrate.

An aspect of the present disclosure is to provide a multilayer electronic component that can be mounted on a substrate without using a solder.

However, an object of the present disclosure is not limited thereto, and it will be more easily understood in a course of describing the specific embodiment of the present disclosure.

According to an aspect of the present disclosure, a multilayer electronic component includes: a body including a dielectric layer and an internal electrode alternately disposed with the dielectric layer; and an external electrode including an electrode layer disposed on the body and an Sn plating layer disposed on the electrode layer. A thickness of the body is defined as Tb, a thickness of the Sn plating layer is defined as Ts, Tb is 0.22 mm or less, and Ts is 4.5 µm or more.

According to another aspect of the present disclosure, in a mounting substrate on which a multilayer electronic component according to an embodiment of the present disclosure is mounted, the mounting substrate includes: an electrode pad disposed on one surface of the substrate, wherein an Sn plating layer of the multilayer electronic component is disposed to be in contact with the electrode pad.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
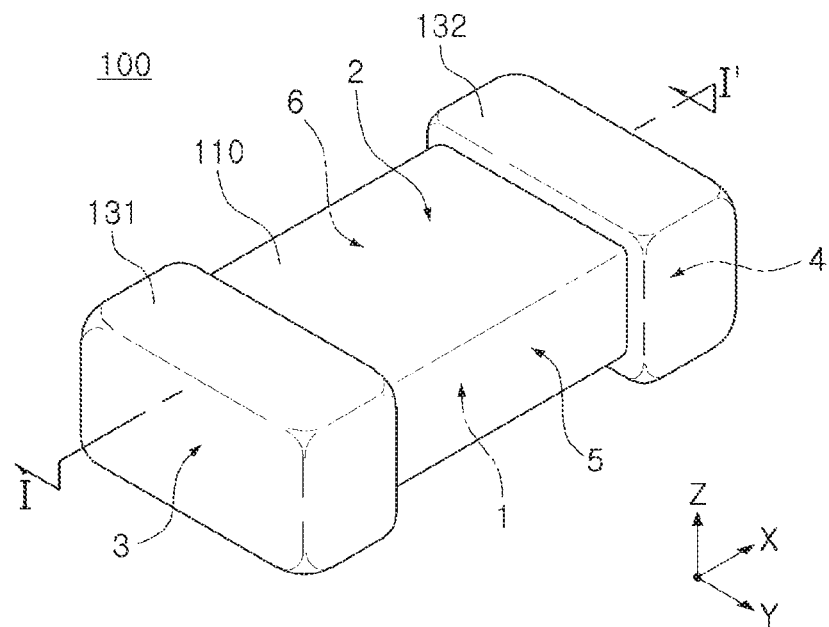
FIG. 1 is a perspective view schematically illustrating a multilayer electronic component according to an embodiment of the present disclosure.

Hereinafter, embodiments of the present disclosure will be described as follows with reference to the attached drawings. The present disclosure may, however, be exemplified in many different forms and should not be construed as being limited to the specific embodiments set forth herein. Rather, these embodiments are provided so that this disclosure will be through and complete, and will fully convey the scope of the disclosure to those skilled in the art. Accordingly, shapes and sizes of elements in the drawings may be exaggerated for clarity of description, and elements indicated by the same reference numeral are same elements in the drawings.

In the drawings, irrelevant descriptions will be omitted to clearly describe the present disclosure, and to clearly express a plurality of layers and areas, thicknesses may be magnified. The same elements having the same function within the scope of the same concept will be described with use of the same reference numerals. Throughout the specification, when a component is referred to as "comprise" or "comprising," it means that it may include other components as well, rather than excluding other components, unless specifically stated otherwise.

A value used to describe a parameter such as a 1-D dimension of an element including, but not limited to, "length," "width," "thickness," diameter," "distance," "gap," and/or "size," a 2-D dimension of an element including, but not limited to, "area" and/or "size," a 3-D dimension of an element including, but not limited to, "volume" and/or "size", and a property of an element including, not limited to, "roughness," "density," "weight," "weight ratio," and/or "molar ratio" may be obtained by the method(s) and/or the tool(s) described in the present disclosure. The present disclosure, however, is not limited thereto. Other methods and/or tools appreciated by one of ordinary skill in the art, even if not described in the present disclosure, may also be used.

In the drawings, an X direction may be defined as a second direction, an L direction or a length direction, a Y direction may be defined as a third direction, a W direction or a width direction, and a Z direction may be defined as a first direction, a stacking direction, a T direction, or a thickness direction.

Multilayer Electronic Component

FIG. 1 is a perspective view schematically illustrating a multilayer electronic component according to an embodiment of the present disclosure.

Figure 2:
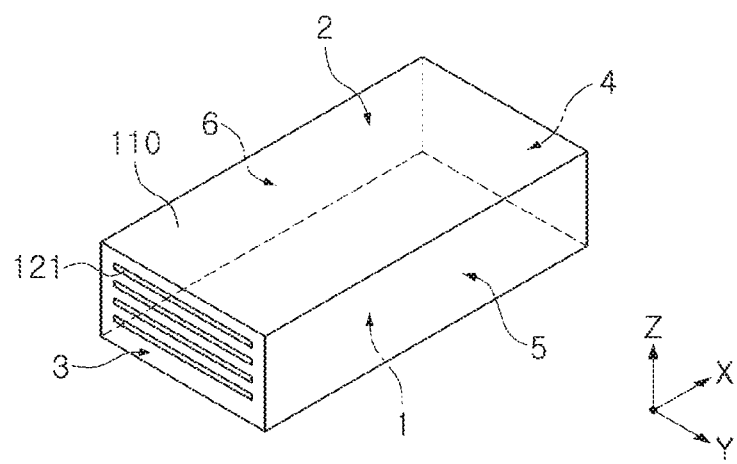
FIG. 2 is a perspective view of a body of the multilayer electronic component of FIG. 1 except for an external electrode.

FIG. 2 is a perspective view of a body of the multilayer electronic component of FIG. 1 except for an external electrode.

Figure 3:
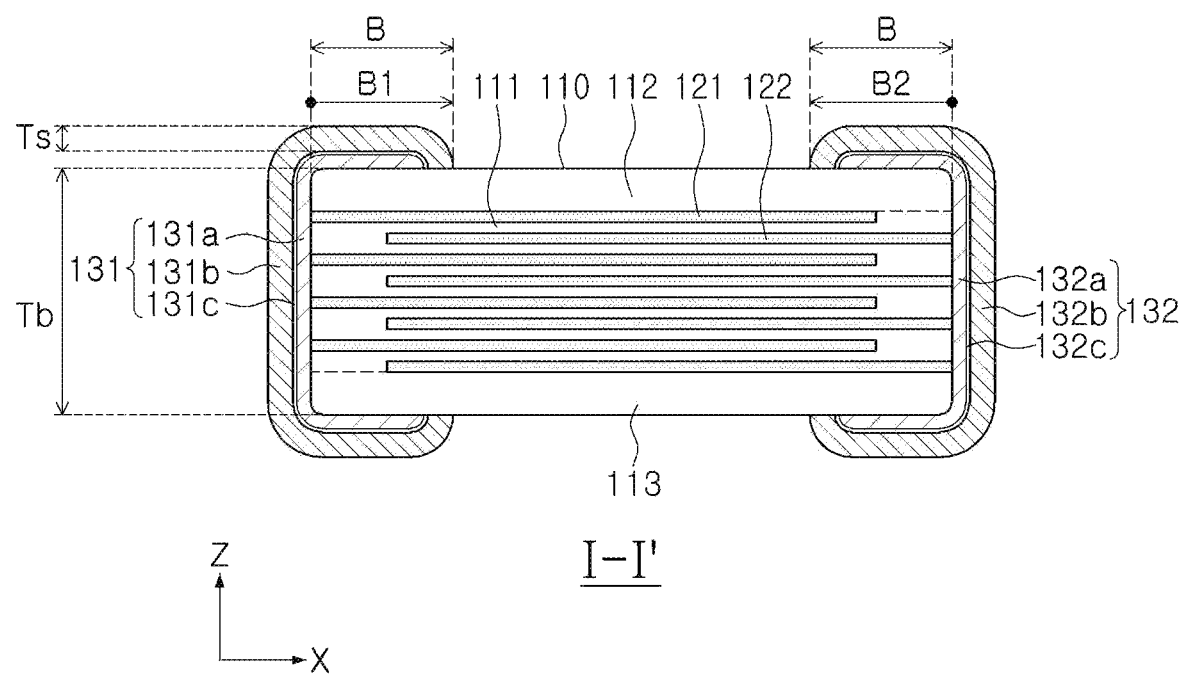
FIG. 3 is a cross-sectional view taken along line I-I' of FIG. 1.

FIG. 3 is a cross-sectional view taken along line I-I' of FIG. 1.

Figure 4:
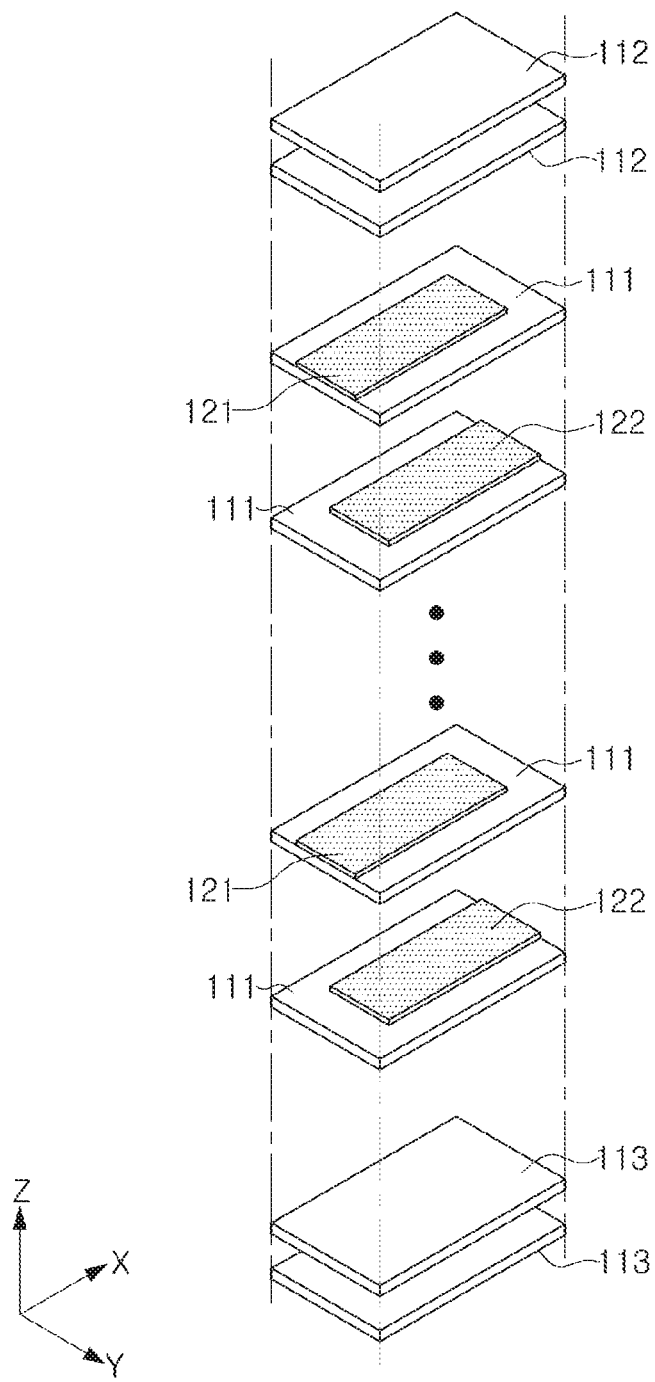
FIG. 4 is an exploded perspective view schematically illustrating a body in which a dielectric layer and an internal electrode are stacked according to an embodiment of the present disclosure.

FIG. 4 is an exploded perspective view schematically illustrating a body in which a dielectric layer and an internal electrode are stacked according to an embodiment of the present disclosure.

Hereinafter, a multilayer electronic component 100 according to an embodiment of the present disclosure will be described with reference to FIGS. 1 to 4.

According to an embodiment of the present disclosure, a multilayer electronic component 100 includes a body 110 including a dielectric layer 111 and internal electrodes 121 and 122 alternately disposed with the dielectric layer 111; and external electrodes 131 and 132 including electrode layers 131a and 132a, disposed on the body, and Sn plating layers 131b and 132b disposed on the electrode layer 131a and 132a, respectively. When a thickness of the body is defined as Tb, and a thickness of the Sn plating layer is defined as Ts, Tb is 0.22 mm or less, and Ts is 4.5 μm or more.

The body 110 has a dielectric layer 111 and internal electrodes 121 and 122, which are alternately stacked.

A specific shape of the body 110 is not particularly limited, but as illustrated, the body 110 may have a hexahedral shape, or a shape similar thereto. Due to shrinkage of ceramic powder particles included in the body 110 during a sintering process, the body 110 may have a substantially hexahedral shape, but may not have a hexahedral shape having completely straight lines.

The body 110 may have first and second surfaces 1 and 2 opposing each other in a thickness direction (Z direction), third and fourth surfaces 3 and 4 connected to the first and second surfaces 1 and 2 and opposing each other in a length direction (X direction), and fifth and sixth surfaces 5 and 6 connected to the first and second surfaces 1 and 2 and connected to the third and fourth surfaces 3 and 4 and opposing each other in a width direction (Y direction).

The plurality of dielectric layers 111 forming the body 110 are in a sintered state, and a boundary between adjacent dielectric layers 111 may be integrated, such that it may be difficult to confirm without using a scanning electron microscope (SEM).

According to an embodiment of the present disclosure, a raw material for forming the dielectric layer 111 is not particularly limited, as long as sufficient electrostatic capacitance may be obtained therewith. For example, the raw material for forming the dielectric layer 111 may be a barium titanate ($BaTiO_3$)-based material, a lead composite perovskite-based material, a strontium titanate ($SrTiO_3$)-based material, or the like. The barium titanate-based material may include $BaTiO_3$-based ceramic powder, and the ceramic powder may be, for example, $BaTiO_3$, $(Ba_{1-x}Ca_x)TiO_3$, $Ba(Ti_{1-y}Ca_y)O_3$, $(Ba_{1-x}Ca_x)(Ti_{1-y}Zr_y)O_3$ or $Ba(Ti_{1-y}Zr_y)O_3$, in which calcium (Ca), zirconium (Zr), or the like, are partially dissolved in $BaTiO_3$, and the like.

A material for forming the dielectric layer 111, various ceramic additives, organic solvents, plasticizers, binders, dispersants, and the like, may be added to powder particles such as barium titanate ($BaTiO_3$) according to the purpose of the present disclosure.

The body 110 may include a capacitance formation portion disposed in the body 110 and including a first internal electrode 121 and a second internal electrode 122 disposed to oppose each other with the dielectric layer 111 interposed therebetween and having capacitance formed therein, and protective portions 112 and 113 formed in upper and lower portions of the capacitance formation portion, respectively.

The capacitance formation portion is a portion serving to contribute to capacitance formation of the capacitor, and may be formed by repeatedly laminating a plurality of first and second internal electrodes 121 and 122 with a dielectric layer 111 interposed therebetween.

The upper protective layer 112 and the lower protective layer 113 may be formed by laminating a single dielectric layer or two or more dielectric layers on the upper and lower surfaces of the capacitance formation portion in an up-and-down direction, respectively, and the upper protective layer 112 and the lower protective layer 113 may serve to basically prevent damage to the internal electrodes due to physical or chemical stress.

The upper protective layer 112 and the lower protective layer 113 may not include internal electrodes, and may include the same material as that of the dielectric layer 111.

The internal electrodes 121 and 122 may be alternately disposed with the dielectric layer 111. The internal electrodes 121 and 122 may include first and second internal electrodes 121 and 122 alternately disposed to oppose each other with the dielectric layer interposed therebetween.

The first and second internal electrodes 121 and 122 may be exposed to the third and fourth surfaces 3 and 4 of the body 110, respectively.

Referring to FIGS. 1 to 3, the first internal electrode 121 may be spaced apart from the fourth surface 4 and exposed through the third surface 3, and the second internal electrode 122 may be spaced apart from the third surface 3 and exposed through the fourth surface 4. A first external electrode 131 may be disposed on the third surface 3 of the body to be connected to the first internal electrode 121, and a second external electrode 132 may be disposed on the fourth surface 4 of the body to be connected to the second internal electrode 122.

That is, the first internal electrode 121 is not connected to the second external electrode 132, but is connected to the first external electrode 131, and the second internal electrode 122 is not connected to the first external electrode 131, but is connected to the second external electrode 132. Therefore, the first internal electrode 121 is formed to be spaced apart from the fourth surface 4 by a predetermined distance, and the second internal electrode 122 is formed to be spaced apart from the third surface 3 by a predetermined distance.

The first and second internal electrodes 121 and 122 may be electrically separated from each other by the dielectric layer 111 disposed in the middle.

Referring to FIG. 4, the body 110 may be formed by alternately stacking a dielectric layer 111 on which the first internal electrode 121 is printed and a dielectric layer 111 on which the second internal electrode 122 is printed in a thickness direction (Z direction), and then firing.

A material for forming the internal electrodes 121 and 122 is not particularly limited, and a material having excellent electrical conductivity may be used. For example, the internal electrodes may be formed by printing a conductive paste for internal electrodes containing one or more of nickel (Ni), copper (Cu), palladium (Pd), silver (Ag), gold (Au), platinum (Pt), tin (Sn), tungsten (W), titanium (Ti), and an alloy thereof, on a ceramic green sheet.

As a printing method of the conductive paste for internal electrodes, a screen printing method, a gravure printing method, or the like, may be used, but the present disclosure is not limited thereto.

External electrodes 131 and 132 are disposed on the body 110 and include electrode layers 131a and 132a and Sn plating layers 131b and 132b.

The external electrodes 131 and 132 may include first and second external electrodes 131 and 132 connected to the first and second internal electrodes 121 and 122, respectively.

The first external electrode 131 may include a first electrode layer 131a and a first Sn plating layer 131b, and the second external electrode 132 may include a second electrode layer 132a and a second Sn plating layer 132b.

The first and second external electrodes 131 and 132 may include band portions B extending to a portion of the first and second surfaces 1 and 2 of the body 110, respectively. A length of the band portion B of the first external electrode 131 may mean a distance B1 from the third surface 3 to an end of the band portion B of the first external electrode 131 in the length direction (X direction), and a length of the band portion B of the second external electrode 132 may mean a distance B2 from the fourth surface 4 to an end of the band portion B of the second external electrode 132 in the length direction (X direction).

Meanwhile, the electrode layers 131a and 132a may be formed of any material as long as it has electrical conductivity such as a metal, or the like, and a specific material may be determined in consideration of electrical characteristics, structural stability, and the like.

The conductive metal used for the electrode layers 131a and 132a is not particularly limited as long as it is a material that can be electrically connected to the internal electrode to form capacitance. For example, it may include one or more selected from a group consisting of nickel (Ni), copper (Cu), palladium (Pd), silver (Ag), gold (Au), platinum (Pt), tin (Sn), tungsten (W), titanium (Ti), and alloys thereof.

For example, the electrode layers 131a and 132a may be plastic electrodes including conductive metal and glass, or resin-based electrodes including a conductive metal and a resin. In addition, the electrode layers 131a and 132a may have a form in which plastic electrodes and resin-based electrodes are sequentially formed on the body.

In addition, the electrode layers 131a and 132a may be formed by transferring a sheet containing conductive metal on the body 110, or may be formed by transferring a sheet containing conductive metal on a sintered electrode.

In addition, the electrode layers 131a and 132a may also be formed using an atomic layer deposition (ALD) method, a molecular layer deposition (MLD) method, a chemical vapor deposition (CVD) method, a sputtering method, or the like.

In addition, the electrode layers 131a and 132a may further include a Ni plating layer 132c disposed at an interface with Sn plating layers 131b and 132b.

The Sn plating layers 131b and 132b are disposed on the electrode layers 131a and 132a and serve to improve mounting characteristics. In addition, the Sn plating layers 131b and 132b serves to maintain adhesion strength between a substrate 10 to be described below and the multilayer electronic component 100 and serve to electrically connect electrode pads 31 and 32 of the substrate 10 and the external electrodes 131 and 132.

In general, a surface mounting technology (SMT) was used to fix and electrically connect a multilayer electronic component to a substrate. Here, the surface mounting technology means a method of applying a solder on an electrode pad of a substrate, disposing an external electrode of a multilayer electronic component on the solder, and then mounting the multilayer electronic component on the substrate through a reflow heat treatment. A solder serves to maintain adhesion strength of the mounted electronic component and realize electrical characteristics. However, a volume occupied by the solder requires an additional space allocated to the electronic component. In particular, in the case of the length and/or width direction of the electronic component, it can be considered that a method in which an amount of solder supplied is reduced, or a small amount of solder is applied only to a land portion. However, in the case of the thickness direction, since the electronic component is mounted on the solder in a floating state, the solder enters between a land of the substrate and an external electrode of the multilayer electronic component, thereby making it difficult to reduce a volume in the thickness direction. In particular, in the case of a low-profile multilayer electronic component having a small thickness, such a problem was even greater because of constraints on the size in the thickness direction limit were high.

When the present inventors secure the thickness of the Sn plating layer to a certain level or higher, they can be mounted on a substrate without using a solder, and it has been found that it is possible to reduce the space in the thickness direction while securing adhesion strength similar to that of mounting using a solder, and the present disclosure has been reached.

In the present disclosure, when the thickness of the body 110 is defined as Tb, and the thickness of the Sn plating layers 131b and 132b is defined as Ts, Tb is 0.22 mm or less and ts is 4.5 μm or more.

In the case of mounting using a solder, it was sufficient that the thickness of the Sn plating layer of the low-profile multilayer electronic component is about 1 to 3 μm, but to be mounted without using a solder as in the present disclosure, the thickness Ts of the Sn plating layers 131b and 132b should be 4.5 μm or more. When the thickness Ts of the Sn plating layers 131b and 132b is less than 4.5 μm, there may be a problem that the multilayer electronic component pops when mounted, and there is concern that the adhesion strength between the substrate 10 and the stacked electronic component may not be sufficiently secured. An upper limit of the thickness Ts of the Sn plating layers 131b and 132b is not particularly limited, and can be appropriately determined in consideration of the space of the mounting substrate to be disposed.

In addition, the thickness Tb of the body 110 should be 0.22 mm or less. When the thickness Tb of the body 110 exceeds 0.22 mm, there is concern that sufficient adhesion strength may not be secured even if the thickness is of the Sn plating layers 131b and 132b is 4.5 μm or more, and the effect of securing the space in the thickness direction according to the present disclosure may be insufficient.

Figure 7:
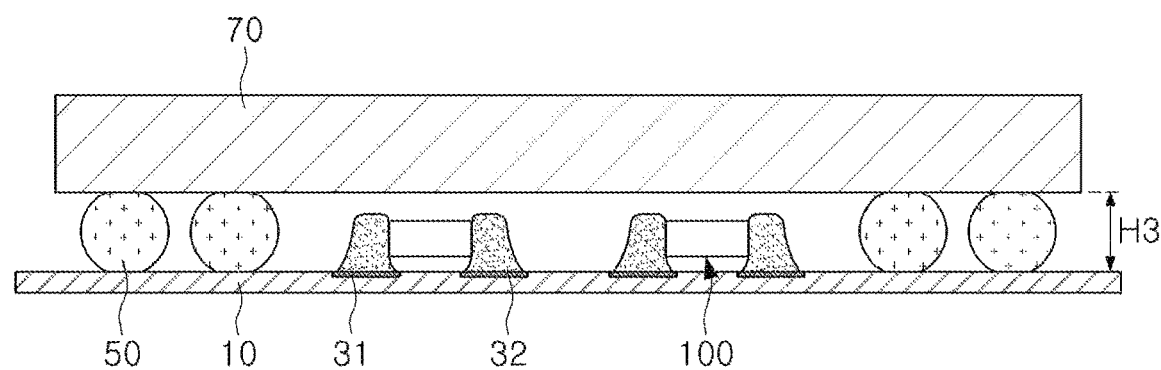
FIG. 7 is a view illustrating a modification example of a mounting substrate according to another embodiment of the present disclosure.

In addition, since the space in the thickness direction can be secured according to the present disclosure, it is possible to maximize the utilization of the space on the substrate by arranging passive elements in space not previously used on the mounting substrate. For example, as shown in FIG. 7, the multilayer electronic component may be disposed under an application processor (AP) or CPU to maximize utilization of the space on a substrate.

After preparing 100 sample chips for each Test No. satisfying the thickness Tb of the body and the thickness Ts of the Sn plating layer in Table 1 below, an external electrode of the sample chip was disposed on the electrode pad of the substrate without using solder, and then mounted the sample chip thereon through a reflow heat treatment. A shear stress (gf) was measured in order to confirm the adhesion strength, and an average value thereof was obtained, and then a mounting state was evaluated and was shown in Table 1 below.

The mounting state was represented by O, when a tombstone defect occurs among 100 sample chips per each unit Test No, or when the number of sample chips mounted to be inclined, not parallel to the substrate is 1% or less, it was represented by Δ when more than 1% and less than 10%, and it was represented by X when more than 10%. Here, the tombstone defect means a defect in which one external electrode of the chip rises and is separated from the electrode pad after the reflow heat treatment.

TABLE 1

| Test No. | Tb (mm) | Ts (μm) | Shear stress (gf) | Mounting state |
|---|---|---|---|---|
| 1* | 0.2 | 1 | 98 | X |
| 2* | 0.2 | 3 | 290 | Δ |
| 3 | 0.2 | 5 | 310 | O |

Test No. 1 illustrates a case in which Ts is 1 μm. In Test No. 1, it can be confirmed that shear stress is less than 100 gf and it is difficult to secure adhesion strength, and a mounting state thereof is also poor.

Test No. 2 illustrates a case in which Ts is 3 μm. In Test No. 2, although a shear stress can be secured to a certain extent, a sufficient amount of solder for normal mounting of a chip is not secured, a tombstone defect occurred or a large number of sample chips were mounted to be inclined, rather than parallel, to the substrate occurred, and thus amounting state was not good.

On the other hand, Test No. 3 illustrates a case in which Ts is 5 μm. In Test No. 3, it can be confirmed that a shear stress was 300 gf or more and was able to secure sufficient adhesion strength, and a mounting state was also good.

In this case, Ts/Tb, a ratio of the thickness Ts of the Sn plating layer to the thickness Tb of the body, may satisfy 0.02 or more.

When Ts/Tb is less than 0.02, there may be concern that sufficient fixing strength may not be secured, and an effect of securing a space in a thickness direction according to the present disclosure may be insufficient.

In addition, the thickness Tb of the body may be a length in a direction in which the dielectric layer 111 and the internal electrodes 121 and 122 are alternately disposed. That is, the dielectric layer 111 and the internal electrodes 121 and 122 are alternately disposed in a first direction (a Z direction), and Tb may mean the length of the body 110 in the first direction (the Z direction). In addition, the first surface or the second surface, both surfaces of the body 110 in the first direction (the Z direction), may be a mounting surface facing the substrate.

In addition, the thickness Ts of the Sn plating layer may mean a distance from outer surfaces of the electrode layers 131a and 132a to an outer surface of the Sn plating layer.

Referring to FIG. 3, the first and second external electrodes 131 and 132 may include band portions B extending to a portion of the first and second surfaces of the body 110, respectively. A length of the band portion B of the first external electrode 131 may mean a distance B1 from the third surface to an end of the band portion B of the first external electrode 131, and a length of the band portion B of the second external electrode 132 may mean a distance B2 from the fourth surface to an end of the band portion B of the second external electrode 132.

In this case, a difference between B1 and B2 may be 30 μm or less. When the difference between B1 and B2 exceeds 30 μm, an amount of the Sn plating layer 131b of the first external electrode and the Sn plating layer 132b of the second external electrode is unbalanced, so that a tombstone defect may occur, but it may be inclined, not parallel to the substrate to cause a mounting failure.

Meanwhile, B1, B2, Ts, and Tb may be measured from an image in which a cross-section (an X-Z plane or an L-T plane) of the body 110 in the length and thickness directions, cut at a center of the body 110 in the width direction (the Y direction), is scanned by a scanning electron microscope (SEM).

In particular, B1 may be a value having a distance in the X direction, measured from a point at which an extension line of the third surface and an extension line of the second surface meet, to an end of the Sn plating layer 131b, in the image, and B2 may be a value having a distance in the X direction, measured from a point at which an extension line of the fourth surface and the extension line of the second surface meet, to an end of the Sn plating layer 131b, in the image.

Tb may be a value having a distance in the Z direction, measured from the point at which the extension line of the third surface and the extension line of the second surface meet, to a point at which the extension line of the third surface and an extension line of the first surface meet, in the image.

Ts may be an average value of thicknesses of the Sn plating layer 131b, calculated by equally dividing a distance in the X direction, measured from the point at which the extension line of the third surface and the extension line of the second surface meet, to the end of the electrode layer 131a disposed on the second surface, in the image, into ten (10) sections, and averaging thicknesses of the Sn plating layer 131b measured at five central points among the ten (10) sections. In this case, the thickness of the Sn plating layer refers to a distance in the Z direction, measured from an outer surface of the electrode layer 131a to an outer surface of the Sn plating layer 131b.

Mounting Substrate

Figure 5:
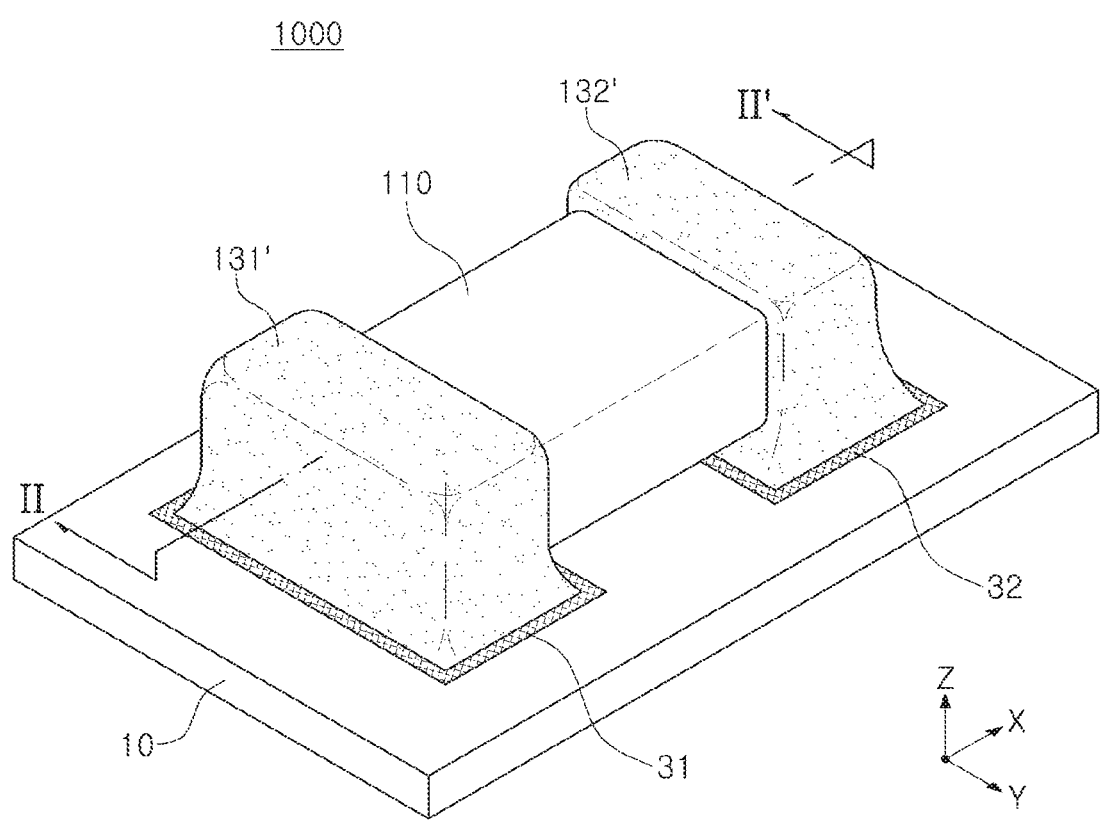
FIG. 5 is a perspective view schematically illustrating a mounting substrate according to another embodiment of the present disclosure.

FIG. 5 is a perspective view schematically illustrating a mounting substrate according to another embodiment of the present disclosure.

Figure 6:
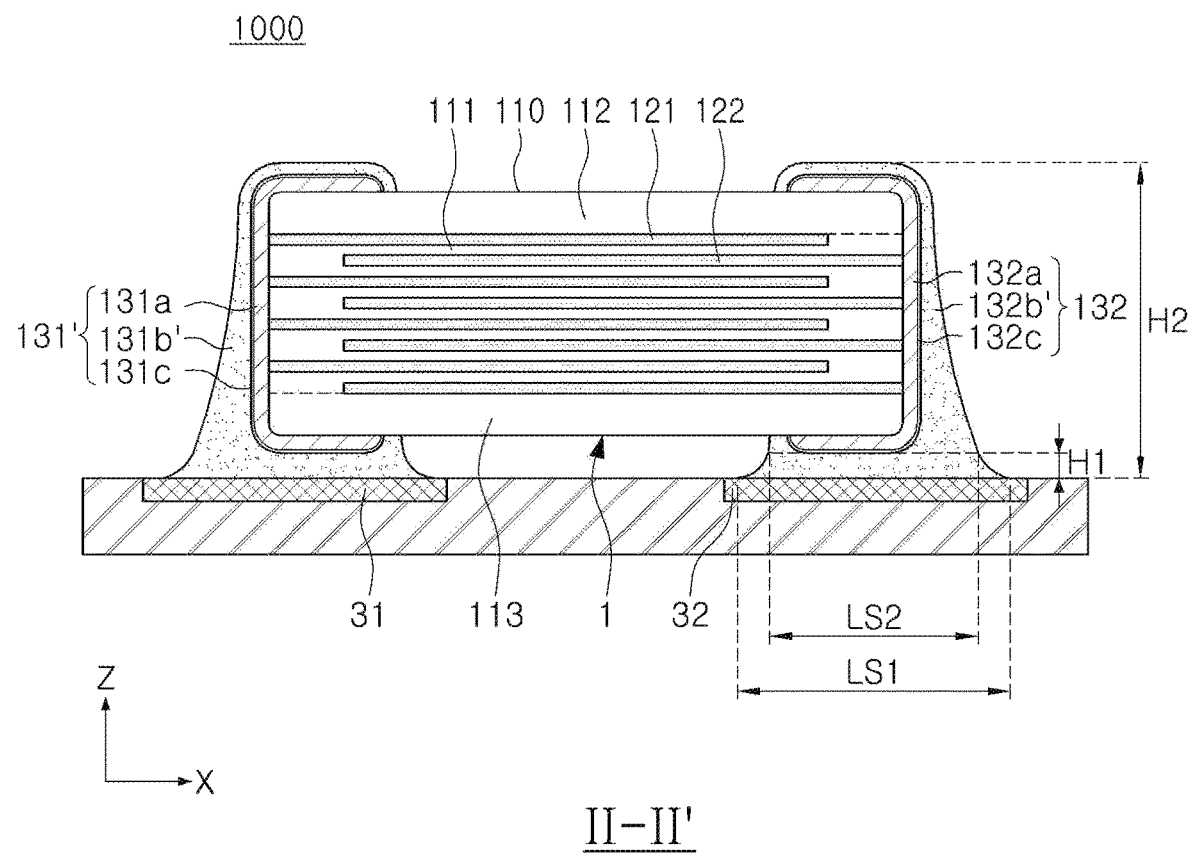
FIG. 6 is a cross-sectional view taken along line II-II' of FIG. 5.

FIG. 6 is a cross-sectional view taken along line II-II' of FIG. 5.

FIG. 7 is a view illustrating a modification example of a mounting substrate according to another embodiment of the present disclosure.

Hereinafter, a mounting substrate 1000 according to another embodiment of the present disclosure will be described in detail with reference to FIGS. 5 to 7. However, in order to avoid overlapping descriptions, descriptions common to the multilayer electronic component 100 according to an embodiment of the present disclosure are omitted.

In a mounting substrate 1000 according to another embodiment of the present disclosure, a multilayer electronic component 100 according to an embodiment of the present disclosure described above is mounted. The mounting substrate 1000 includes a substrate 10 including electrode pads 31 and 32 disposed on one surface; and a multilayer electronic component including a body including a dielectric layer 111 and internal electrodes 121 and 122 alternately disposed with the dielectric layer, and external electrodes including electrode layers 131a and 132a disposed on the body and Sn plating layers 131b' and 132b' disposed on the electrode layer. The Sn plating layer is disposed to be in contact with the electrode pad.

After the external electrodes 131 and 132 of the multilayer electronic component 100 are disposed on the electrode pads 31 and 32 of the substrate 10, they may be mounted through a reflow heat treatment. In the reflow heat treatment process, the Sn plating layers 131b and 132b may be melted and then hardened to adhere to the electrode pads 31 and 32 and may have a form of the Sn plating layers 131b' and 132b' shown in FIGS. 5 to 7.

In the case of using a conventional surface mount technology in which a solder is applied on an electrode pad, an external electrode of a multilayer electronic component is disposed on the solder, and then the multilayer electronic component is then mounted on a substrate through a reflow heat treatment, although a surface of the Sn plating layers 131b' and 132b' do not directly contact the electrode pad, in the present disclosure, since no solder is used, the Sn plating layers 131b' and 132b' are disposed to directly contact the electrode pads 31 and 32.

In addition, since the Sn plating layers 131b and 132b are melted during the reflow heat treatment process, and the molten Sn plating layers flow down by gravity, a length of the Sn plating layers 131b' and 132b', parallel to the substrate 10, may be the longest at the interface between the Sn plating layers 131b' and 132b' and the electrode pads 31 and 32.

Referring to FIG. 6, a length LS1 of the Sn plating layer at an interface between the Sn plating layer and the electrode pad may be longer than a length LS2 of the Sn plating layer at an interface between the Sn plating layer and the electrode layer. That is, the length of the Sn plating layer may have a shape becoming shorter away from the substrate 10.

Meanwhile, one or more flux and molecule organic matters may be included at the interface between the Sn plating layers 131b' and 132b' and the electrode pads 31 and 32.

In the case of mounting using solder, the solder may serve to fix the multilayer electronic component until a reflow heat treatment, but in the present disclosure, since no solder is used, one or more flux and monomolecular organic matters may be printed on the electrode pad to fix the multilayer electronic component until the reflow heat treatment.

Flux and monomolecular organic matters are easy to remove even if they are sufficiently blown or left at low temperature, and have little electrical effect, so they do not affect to secure a space in a thickness direction. However, since one or more of flux and single molecule organic matters may be partially detected at an interface between the Sn plating layer and the electrode pad, one or more of flux and single molecule organic matters may be included at the interface between the Sn plating layer and the electrode pad.

For a specific example, the flux may be one or more of a resin-based, inorganic-based, and organic-based, and the single-molecule organic matter may be one or more of a resin, a plasticizer, a viscosity agent, a dispersant, and an epoxy-based adhesive.

A shortest distance H1 from the electrode pads 31 and 32 to the electrode layers 131a and 132a may be 0.1 to 5 μm.

If H1 is less than 0.1 μm, adhesion strength may not be sufficient, and when H1 exceeds 5 μm, the height H2 of the mounted multilayer electronic component may be too large to utilize a space in the thickness direction.

In addition, the substrate 10 may further include a solder ball 50 disposed on one surface of the substrate and an application processor AP 70 disposed on the multilayer electronic component, and a height H3 of the solder ball may be greater than a height H2 of the multilayer electronic component.

Conventionally, a space between the application processor 70 and the substrate 10 was a space that was not used or difficult to be utilized, but, according to the present disclosure, since it can be mounted without using a solder, it is possible to minimize the height H2 of the multilayer electronic component, such that the multilayer electronic component 100 may disposed in the space between the application processor AP and the substrate 10. Accordingly, it is possible to maximize utilization of space on the mounting substrate.

As set forth above, according to the present disclosure, by adjusting the thickness of the body and the thickness of the Sn plating layer, it is possible to provide a multilayer electronic component that can be mounted on a substrate without using a solder.

In addition, as one of various effects of the present disclosure, it is possible to provide a multilayer electronic component capable of securing sufficient mounting reliability without using a solder.

However, various and advantageous advantages and effects of the present disclosure are not limited to the above description, and will be more readily understood in the process of describing specific embodiments of the present disclosure.

While exemplary embodiments have been shown and described above, it will be apparent to those skilled in the art that modifications and variations could be made without departing from the spirit and scope of the present disclosure as defined by the appended claims.

What is claimed is:

1. A mounting substrate on which a multilayer electronic component is mounted, the multilayer electronic component comprising a body including a dielectric layer and an internal electrode alternately disposed with the dielectric layer; and an external electrode including an electrode layer disposed on the body and an Sn plating layer disposed on the electrode layer, wherein an average value of thicknesses of the Sn plating layer is defined as Ts, and Ts is 4.5 um or more, the mounting substrate comprising: a substrate including an electrode pad disposed on one surface thereof, and the multilayer electronic component, wherein the Sn plating layer is disposed to be in direct contact with the electrode pad, and wherein the contact between the electrode pad and the external electrode is devoid of a solder.

2. The mounting substrate of claim 1, wherein a thickness of the body is defined as Tb, and Tb is 0.22 mm or less.

3. The mounting substrate of claim 1, wherein Ts is a distance from an outer surface of the electrode layer to an outer surface of the Sn plating layer.

4. The mounting substrate of claim 1, wherein the electrode layer further comprises a Ni plating layer disposed at an interface with the Sn plating layer.

5. The mounting substrate of claim 1, wherein a length of the Sn plating layer, parallel to the substrate, is longer at an interface at which the Sn plating layer and the electrode pad are in direct contact with each other than a length of the Sn plating layer at an interface between the Sn plating layer and the electrode layer.

6. The mounting substrate of claim 1, wherein an interface between the Sn plating layer and the electrode pad comprises one or more of flux and a monomolecular organic matter.

7. The mounting substrate of claim 1, wherein a shortest distance from the electrode pad to the electrode layer is 0.1 to 5 μm.

8. The mounting substrate of claim 1, further comprising a solder ball disposed on one surface of the substrate, and an application processor disposed on the solder ball and the multilayer electronic component,
wherein a height of the solder ball is greater than a height of the multilayer electronic component.

9. The mounting substrate of claim 1, wherein the Sn plating layer is disposed directly on the electrode layer.

10. The mounting substrate of claim 2, wherein Ts/Tb, which is a ratio of Ts to Tb, satisfies 0.02 or more.

11. The mounting substrate of claim 2, wherein the body comprises first and second surface opposing in a first direction, third and fourth surfaces connected to the first and second surfaces and opposing in a second direction, and fifth and sixth surfaces connected to the first to fourth surfaces and opposing in a third direction.

12. The mounting substrate of claim 8, wherein the electrode layer includes a conductive metal and glass.

13. The mounting substrate of claim 8, wherein the electrode layer includes a conductive metal and a resin.

14. The mounting substrate of claim 11, wherein the dielectric layer and the internal electrode are alternately disposed in the first direction, and
Tb is the thickness of the body in the first direction.

15. The mounting substrate of claim 11, wherein the first surface or the second surface is a mounting surface.

16. The mounting substrate of claim 11, wherein the external electrode comprises first and second external electrodes disposed on the third and fourth surfaces, respectively,
the first and second external electrodes comprise a band portion extending to a portion of the first and second surfaces, respectively, and
a length of the band portion of the first external electrode is defined as B1 and a length of the band portion of the second external electrode is defined as B2, and a difference between B1 and B2 is 30 μm or less.

* * * * *